(12) United States Patent
Naijo

(10) Patent No.: US 9,853,248 B2
(45) Date of Patent: Dec. 26, 2017

(54) ORGANIC LIGHT-EMITTING ILLUMINATION APPARATUS WITH REFLECTOR

(71) Applicant: Samsung Display Co., Ltd., Yongin (KR)

(72) Inventor: Tsuyoshi Naijo, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 187 days.

(21) Appl. No.: 14/657,609

(22) Filed: Mar. 13, 2015

(65) Prior Publication Data

US 2016/0111685 A1     Apr. 21, 2016

(30) Foreign Application Priority Data

Oct. 15, 2014   (KR) .................. 10-2014-0139064

(51) Int. Cl.
*H01L 51/52*     (2006.01)

(52) U.S. Cl.
CPC ........ *H01L 51/5271* (2013.01); *H01L 51/524* (2013.01); *H01L 51/5234* (2013.01); *H01L 2251/5307* (2013.01); *H01L 2251/5338* (2013.01); *H01L 2251/5361* (2013.01)

(58) Field of Classification Search
CPC ............... H01L 51/5271; H01L 51/524; H01L 51/5234; H01L 2251/5307; H01L 2251/5361; H01L 2251/5338
See application file for complete search history.

(56) References Cited

U.S. PATENT DOCUMENTS

| 4,597,635 | A | 7/1986 | Hoshikawa | |
|---|---|---|---|---|
| 6,501,528 | B1 | 12/2002 | Hamada | |
| 7,630,027 | B2 * | 12/2009 | Koma | G02F 1/1336 349/110 |
| 8,129,715 | B2 * | 3/2012 | Yamazaki | H01L 51/5256 257/40 |
| 9,190,458 | B2 * | 11/2015 | So | H01L 27/3227 |
| 2005/0121669 | A1 * | 6/2005 | Kobayashi | H01L 27/322 257/40 |

(Continued)

FOREIGN PATENT DOCUMENTS

| KR | 10-2001-0051880 | 6/2001 |
|---|---|---|
| KR | 10-2007-0011011 | 1/2007 |

(Continued)

*Primary Examiner* — John P Dulka
(74) *Attorney, Agent, or Firm* — H.C. Park & Associates, PLC

(57) ABSTRACT

An organic light-emitting illumination apparatus that may be easily manufactured and may provide high-brightness illumination, and a method of manufacturing the same. The organic light-emitting illumination apparatus includes: a first flexible substrate; a first electrode disposed on the first flexible substrate and configured to transmit light; an intermediate layer disposed on the first electrode and including a light emission layer; a second electrode disposed on the intermediate layer and configured to transmit light; a second flexible substrate disposed on the second electrode; and a reflector interposed between the second flexible substrate and the second electrode to correspond to a first region of the second flexible substrate.

8 Claims, 5 Drawing Sheets

(56) References Cited

U.S. PATENT DOCUMENTS

| | | | |
|---|---|---|---|
| 2006/0251377 A1* | 11/2006 | Uemoto | G02B 6/0055 |
| | | | 385/146 |
| 2008/0136337 A1* | 6/2008 | Rogojevic | H01L 25/048 |
| | | | 315/169.3 |
| 2010/0201604 A1 | 8/2010 | Kee et al. | |
| 2011/0101346 A1* | 5/2011 | Tateishi | H01L 27/12 |
| | | | 257/43 |
| 2013/0234149 A1* | 9/2013 | Halderman | H01L 33/32 |
| | | | 257/76 |
| 2014/0145161 A1* | 5/2014 | Naijo | H01L 51/0097 |
| | | | 257/40 |
| 2016/0104856 A1* | 4/2016 | Naijo | H01L 51/529 |
| | | | 257/40 |

FOREIGN PATENT DOCUMENTS

| | | |
|---|---|---|
| KR | 10-2010-0092222 | 8/2010 |
| KR | 10-2013-0072288 | 7/2013 |
| KR | 10-2015-0014328 | 2/2015 |

* cited by examiner

ORGANIC LIGHT-EMITTING ILLUMINATION APPARATUS WITH REFLECTOR

CROSS REFERENCE TO RELATED APPLICATION

This application claims priority from and the benefit of Korean Patent Application No. 10-2014-0139064, filed on Oct. 15, 2014, which is hereby incorporated by reference for all purposes as if fully set forth herein.

BACKGROUND

Field

Exemplary embodiments of the present invention relate to an organic light-emitting illumination apparatus and a method of manufacturing the same, and more particularly, to an organic light-emitting illumination apparatus that may be easily manufactured and may provide high-brightness illumination, and a method of manufacturing the same.

Discussion of the Background

In general, an organic light-emitting device may be used as a display device of an organic light-emitting display apparatus. Recently, research has been conducted to manufacture an illumination apparatus (not a display apparatus) by using an organic light-emitting device.

However, in the case of an organic light-emitting illumination apparatus, that is, an illumination apparatus including an organic light-emitting device, sufficiently bright light for illumination may not be emitted.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present invention provide an organic light-emitting illumination apparatus which may be easily manufactured and may provide high-brightness illumination, and a method of manufacturing the same.

Additional aspects will be set forth in part in the description which follows and, in part, will be apparent from the description, or may be learned by practice of the presented exemplary embodiments.

An exemplary embodiment of the present invention discloses an organic light-emitting illumination apparatus including: a first flexible substrate; a first electrode disposed on the first flexible substrate and configured to transmit light; an intermediate layer disposed on the first electrode and including a light emission layer; a second electrode disposed on the intermediate layer and configured to transmit light; a second flexible substrate disposed on the second electrode; and a reflector interposed between the second flexible substrate and the second electrode to correspond to a first region of the second flexible substrate.

An exemplary embodiment of the present invention also discloses a method of manufacturing an organic light-emitting illumination apparatus, including: preparing a first flexible substrate; forming a first electrode configured to transmit light on the first flexible substrate; forming an intermediate layer, including a light emission layer, on the first electrode; forming a second electrode configured to transmit light onto the intermediate layer; preparing a second flexible substrate; forming a reflector corresponding to a first region of the second flexible substrate; and attaching the first flexible substrate and the second flexible substrate such that the reflector faces the second electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
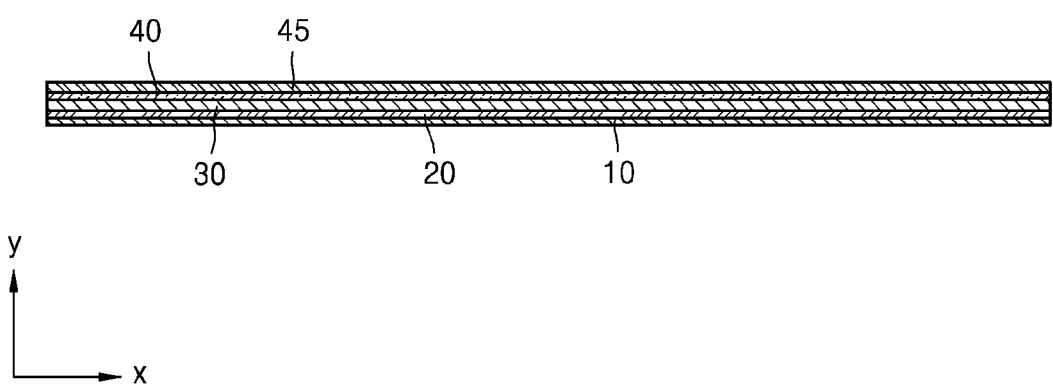
FIG. 1, FIG. 2, and FIG. 3 are cross-sectional views schematically illustrating processes of a method of manufacturing an organic light-emitting illumination apparatus according to an exemplary embodiment.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element such as a layer, film, region or substrate is referred to as being "on" another element, it can be directly on the other element or intervening elements may also be present. In contrast, when an element is referred to as being "directly on" another element, there are no intervening elements present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Figure 2:
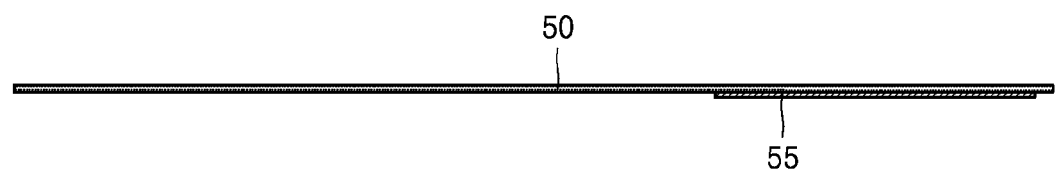
Figure 2:
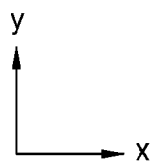
Figure 3:
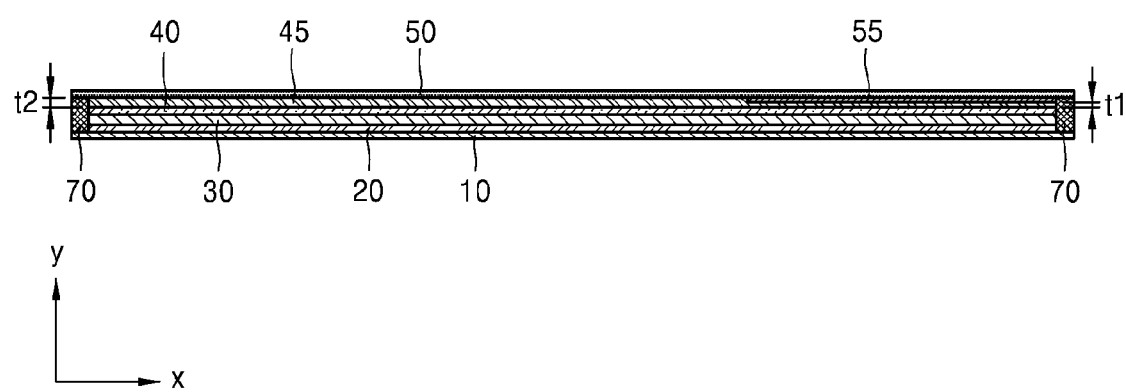

FIGS. 1 to 3 are cross-sectional views schematically illustrating processes of a method of manufacturing an organic light-emitting illumination apparatus according to an exemplary embodiment.

First, a stack structure is formed, as illustrated in FIG. 1. In detail, a first flexible substrate 10 is prepared, and a first electrode 20 configured to transmit light is formed on the first flexible substrate 10. Thereafter, an intermediate layer 30, including a light emission layer, is formed on the first electrode 20, and then a second electrode 40 configured to transmit light is formed on the intermediate layer 30.

The first flexible substrate 10 has flexibility and transmits light. To provide these characteristics, the first flexible substrate 10 may include a polymer material, for example, polyimide. According to an exemplary embodiment, the first flexible substrate 10 may have a multilayer structure, or various other modified structures, such as an alternate stack structure of inorganic layers and organic layers. Also, the first flexible substrate 10 may have a film shape.

The first electrode 20 may be formed of a material capable of transmitting light. The first electrode 20 may be formed of a transparent electrode material, such as indium tin oxide (ITO), indium zinc oxide (IZO), zinc oxide (ZnO), or indium oxide ($In_2O_3$). According to an exemplary embodiment, an auxiliary layer, such as a buffer layer, may be formed on the first flexible substrate 10, and then the first electrode 20 may be formed on the auxiliary layer.

The intermediate layer 30 is formed on the first electrode 20. The intermediate layer 30 may include at least a light emission layer, and may be formed of a low-molecular organic material or a high-molecular organic material.

When the intermediate layer 30 is formed of a low-molecular organic material, the intermediate layer 30 may have a stack structure including a hole injection layer (HIL), a hole transport layer (HTL), an organic emission layer (EML), an electron transport layer (ETL), and an electron injection layer (EIL). In this case, the intermediate layer 30 may include an organic material, such as copper phthalocyanine (CuPc), N,N'-Di(naphthalene-1-yl)-N,N'-diphenyl-benzidine (NPB), or tris-8-hydroxyquinoline aluminum (Alq3). The intermediate layer 30, including a low-molecular organic material, may be formed by mask vacuum deposition.

When the intermediate layer 30 is formed of a high-molecular organic material, the intermediate layer 30 may include a hole transport layer and an organic emission layer. In this case, poly-3,4-ethylendioxythiophene (PEDOT) may be used for the hole transport layer, and a high-molecular organic material, such as poly-phenylenevinylene (PPV) or polyfluorene, may be used for the organic emission layer.

The organic emission layer included in the intermediate layer 30 may emit white light, or may include a red emission layer emitting red light, a green emission layer emitting green light, and a blue emission layer emitting blue light.

The second electrode 40 may be formed on the intermediate layer 30 and may also be formed of a material capable of transmitting light. In detail, the second electrode 40 may also be formed of a transparent electrode material, such as ITO, IZO, ZnO, or $In_2O_3$.

Before, during, or after the process of preparing the stack structure including the first flexible substrate 10, as illustrated in FIG. 2, a second flexible substrate 50 is prepared, and a reflector 55 is formed on the second flexible substrate 50 to correspond to a first region of the second flexible substrate 50.

The second flexible substrate 50 has flexibility and transmits light. To provide these characteristics, the second flexible substrate 50 may include a polymer material, for example, polyimide. According to an exemplary embodiment, the second flexible substrate 50 may have a multilayer structure, and may have various modified structures, such as an alternate stack structure of inorganic layers and organic layers. Also, the second flexible substrate 50 may have a film shape.

In order to reflect light, the reflector 55 may be formed of argentum (Ag), magnesium (Mg), aluminum (Al), platinum (Pt), palladium (Pd), aurum (Au), nickel (Ni), neodymium (Nd), iridium (Ir), chromium (Cr), lithium (Li), calcium (Ci), lithium fluoride (LiF)/Ca, LiF/Al, or any combination thereof.

After the stack structure, including the first flexible substrate 10 illustrated in FIG. 1 and the stack structure including the second flexible substrate 50 illustrated in FIG. 2, is prepared, the stack structures are attached as illustrated in FIG. 3. In detail, the first flexible substrate 10 and the second flexible substrate 50 are attached such that the reflector 55 on the second flexible substrate 50 faces the second electrode 40 on the first flexible substrate 10. The first flexible substrate 10 and the second flexible substrate 50 may be attached in various ways. For example, as illustrated in FIG. 3, the first flexible substrate 10 and the second flexible substrate 50 may be attached by using a sealant 70 that is interposed between the first flexible substrate 10 and the second flexible substrate 50, and is located along edges thereof to cover the intermediate layer 30. In addition to being used to attach the first flexible substrate 10 and the second flexible substrate 50, the sealant 70 may be used to protect the intermediate layer 30 from impurities such as external moisture or oxygen.

According to an exemplary embodiment, unlike the illustration of FIG. 3, at least a portion of the first electrode 20 or the second electrode 40 may extend outside the sealant 70 so that an electrical signal may be transferred to the first electrode 20 or the second electrode 40. Also, the organic light-emitting illumination apparatus may have various modified configurations, such as a configuration in which the organic light-emitting illumination apparatus does not include the sealant 70 and the first flexible substrate 10 and the second flexible substrate 50 may extend, contact each other, and are attached.

Figure 4:
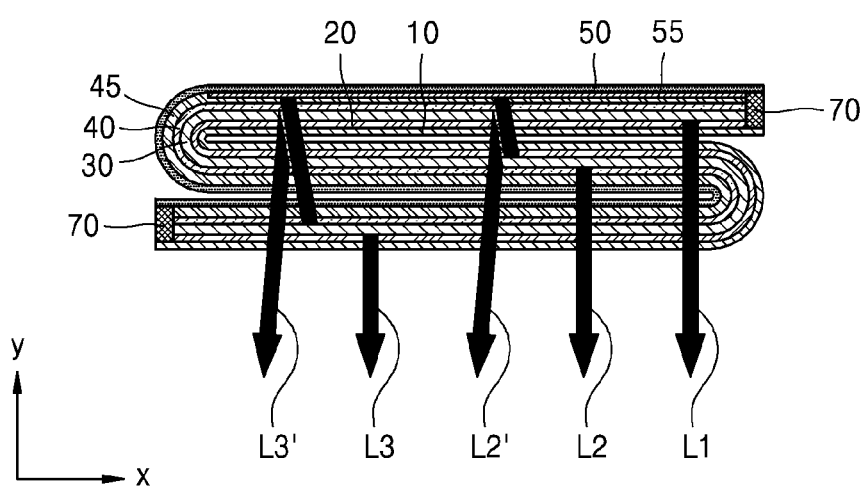
FIG. 4 is a cross-sectional view schematically illustrating an example of use of an organic light-emitting illumination apparatus of FIG. 3.

The organic light-emitting illumination apparatus may be used in various ways. For example, the organic light-emitting illumination apparatus may be used as an illumination apparatus in an unfolded state as illustrated in FIG. 3, or may be used as an illumination apparatus in a state of being folded a plurality of times as illustrated in FIG. 4. When the organic light-emitting illumination apparatus is used as illustrated in FIG. 3, light is emitted from a portion corresponding to the reflector 55 in the −y direction from the reflector 55 toward the first flexible substrate 10. That is, light generated at the intermediate layer 30 is emitted to the outside through the first flexible substrate 10 from the portion corresponding to the reflector 55. Regarding the other portions of the second flexible substrate 50 corresponding to the reflector 55, light generated at the intermediate layer 30 is emitted to the outside through both the first flexible substrate 10 and the second flexible substrate 50. Thus, if only one side is to be illuminated at the portion corresponding to the reflector 55 and both sides are to be illuminated at the residual portion thereof, the organic light-emitting illumination apparatus may be used in the unfolded state illustrated in FIG. 3.

If illumination for emitting high-brightness light in a particular direction is necessary, the organic light-emitting illumination apparatus may be used in a folded state, as illustrated in FIG. 4. In detail, the first flexible substrate 10 and the second flexible substrate 50 may be bent and folded a plurality of times to provide a light emission area corresponding to the reflector 55. In this case, because one edge (in the +x direction) of the reflector 55 is adjacent to one edge (in the +x direction) of the second flexible substrate 50, as illustrated in FIG. 3, when the portion of the second flexible substrate 50 corresponding to the reflector 55 is not covered by the residual portion of the second flexible substrate 50 and the first flexible substrate 10, as illustrated in FIG. 4, the organic light-emitting illumination apparatus corresponding to the area of the reflector 55 may be implemented.

In this case, as illustrated in FIG. 4, a light L1 emitted from the portion corresponding to the reflector 55 of the intermediate layer 30 including the light emission layer is emitted (in the −y direction) through the portion of the second flexible substrate 50 not corresponding to the reflector 55 and the first flexible substrate 10, after or without being reflected by the reflector 55. In this process, the light L1 is emitted to the outside after penetrating the first flexible substrate 10 a plurality of times. In some cases, depending on the number of times of folding the organic light-emitting illumination apparatus, the light L1 is emitted to the outside after also penetrating the second flexible substrate 50 a plurality of times.

Lights L2 and L3 among lights L2, L2', L3, and L3' emitted from the portion not corresponding to the reflector 55 of the intermediate layer 30 including the light emission layer propagate directly in the same direction (the −y direction) as the light L1, and are emitted to the outside, while the other lights L2' and L3' propagate in the direction (the +y direction) toward the reflector 55, are reflected by the reflector 55, propagate in the same direction (the −y direction) as the light L1, and are emitted to the outside.

In the case of the organic light-emitting illumination apparatus according to the exemplary embodiment, when the first flexible substrate 10 and the second flexible substrate 50 are bent and folded a plurality of times to provide a light emission area corresponding to the reflector 55 as illustrated in FIG. 4, because all the lights L1, L2, L2', L3, and L3' propagate in the same direction (the −y direction), a high-brightness organic light-emitting illumination apparatus may be implemented. In this case, because the intensity of an electrical signal applied to emit light at a sufficient brightness level is not increased, and the first flexible substrate 10 and the second flexible substrate 50 are simply bent and folded a plurality of times, a reduction of the lifetime of an organic light-emitting device may be effectively prevented.

Instead of forming the reflector 55 in the first region on the second flexible substrate 50, the first electrode 20 or the second electrode 40 may be formed as a reflective electrode in the first region, and formed as a transparent electrode in other regions. However, in this case, the process of forming the first electrode 20 or the second electrode 40 may be complicated, and thus, the manufacturing yield of organic light-emitting illumination apparatuses may be significantly reduced.

However, in the case of the method of manufacturing the organic light-emitting illumination apparatus according to the exemplary embodiment, the first electrode 20 or the second electrode 40 need only be formed of a material capable of transmitting light in the entire region. Also, the reflector 55 may be formed only in the first region on the second flexible substrate 50 by deposition or sputtering. Thus, in the case of the method of manufacturing the organic light-emitting illumination apparatus according to the exemplary embodiment, because the manufacturing process is simple, the manufacturing yield may be significantly increased.

When a stack structure is formed on the first flexible substrate 10, a buffer layer 45 may be further formed on the second electrode 40, as illustrated in FIG. 1. In this case, as illustrated in FIG. 3, the first flexible substrate 10 and the second flexible substrate 50 may be attached such that the reflector 55 faces the buffer layer 45.

Because the reflector 55 is formed only in the first region that is a partial region of the second flexible substrate 50 when the first flexible substrate 10 and the second flexible substrate 50 are attached, if the buffer layer 45 is not present, the first flexible substrate 10 and the second flexible substrate 50 may not be smoothly attached. For example, in the vicinity of the edge of the reflector 55, due to a step difference caused by the reflector 55, an empty space may exist between the second electrode 40 and the second flexible substrate 50. Also, because the adhesive force between the reflector 55 and the second electrode 40 is not strong, delamination may occur between the reflector 55 and the second electrode 40 in the process of using the organic light-emitting illumination apparatus after completion of the manufacturing process.

However, when the buffer layer 45 is formed on the second electrode 40 and the reflector 55 is brought into contact with the buffer layer 45, the buffer layer 45 and the reflector 55 may be smoothly attached, and thus, the overall stability of the organic light-emitting illumination apparatus may be significantly increased. In particular, if the buffer layer 45 is formed of an elastic material, it may be possible to prevent the occurrence of a step difference caused by the reflector 55 when the first flexible substrate 10 and the second flexible substrate 50 are attached. The buffer layer 45 may be formed of an organic material. In detail, the buffer layer 45 may be formed of a hole transport material that may be included in the intermediate layer 30. A deposition process is performed in the process of forming the first electrode 20, the intermediate layer 30, and the second electrode 40 on the first flexible substrate 10. Thus, because a deposition process is also performed when the buffer layer 45 is formed of a hole transport material, ease of manufacturing may be further increased.

When the buffer layer 45 is formed, because the first flexible substrate 10 and the second flexible substrate 50 are attached, a first thickness t1 of the buffer layer 45 in the first region of the second flexible substrate 50, that is, the first thickness t1 of the buffer layer 45 at a portion corresponding to the reflector 55, may be smaller than a second thickness t2 of the buffer layer 45 in the second region of the second flexible substrate 50. Accordingly, the occurrence of a step difference resulting from the existence of the reflector 55 in the organic light-emitting illumination apparatus may be effectively prevented. According to an exemplary embodiment, the buffer layer 45 may be formed on the entire region of the second electrode 40.

Although the method of manufacturing the organic light-emitting illumination apparatus has been described, exemplary embodiments are not limited thereto and the inventive concept may also include the organic light-emitting illumination apparatus.

An organic light-emitting illumination apparatus according to an exemplary embodiment may have, for example, the configuration shown in FIG. 3. The organic light-emitting illumination apparatus according to the exemplary embodiment may include a first flexible substrate 10, a first electrode 20, an intermediate layer 30, a second electrode 40, a second flexible substrate 50, and a reflector 55.

The first electrode 20 that is capable of transmitting light and is formed on the first flexible substrate 10 and the second electrode 40 that is capable of transmitting light and is formed on the second flexible substrate 50 are disposed to face each other. The intermediate layer 30, including a light emission layer, is interposed between the first electrode 20 and the second electrode 40. In this case, the reflector 55 is interposed between the second flexible substrate 50 and the second electrode 40 to correspond to a first region of the second flexible substrate 50.

The organic light-emitting illumination apparatus may be used in various ways. For example, the organic light-emitting illumination apparatus may be used as an illumination apparatus in an unfolded state as illustrated in FIG. 3, or may be used as an illumination apparatus in a state of being bent a plurality of times as illustrated in FIG. 4. When the organic light-emitting illumination apparatus is used as illustrated in FIG. 3, light is emitted from a portion corresponding to the reflector 55 in a direction (the −y direction) from the reflector 55 toward the first flexible substrate 10. That is, light generated at the intermediate layer 30 is emitted to the outside through the first flexible substrate 10 from the portion corresponding to the reflector 55. Regarding the other portions of the second flexible substrate 50 corresponding to the reflector 55, light generated at the intermediate layer 30 is emitted to the outside through both the first flexible substrate 10 and the second flexible substrate 50. Thus, if only one side is to be illuminated at the portion corresponding to the reflector 55, and both sides are to be illuminated at the residual portion thereof, the organic light-emitting illumination apparatus may be used in an unfolded state, as illustrated in FIG. 3.

If illumination is needed for emitting light having a high brightness level in a particular direction, the organic light-emitting illumination apparatus may be used in a folded state, as illustrated in FIG. 4. In detail, the first flexible substrate 10 and the second flexible substrate 50 may be bent and folded a plurality of times to provide a light emission area corresponding to the reflector 55. In this case, since one edge (in the +x direction) of the reflector 55 is adjacent to one edge (in the +x direction) of the second flexible substrate 50 as illustrated in FIG. 3, when the portion of the second flexible substrate 50 corresponding to the reflector 55 is not covered by the residual portion of the second flexible substrate 50 and the first flexible substrate 10, as illustrated in FIG. 4, the organic light-emitting illumination apparatus corresponding to the area of the reflector 55 may be implemented.

In this case, as illustrated in FIG. 4, a light L1 emitted from the portion corresponding to the reflector 55 of the intermediate layer 30 including the light emission layer is emitted (in the −y direction) through the portion of the second flexible substrate 50 not corresponding to the reflector 55 and the first flexible substrate 10, after or without being reflected by the reflector 55. In this process, the light L1 is emitted to the outside after penetrating the first flexible substrate 10 a plurality of times. In some cases, depending on the number of times of folding the organic light-emitting illumination apparatus, the light L1 is emitted to the outside after also penetrating the second flexible substrate 50 a plurality of times.

Lights L2 and L3 among lights L2, L2', L3, and L3' emitted from the portion not corresponding to the reflector 55 of the intermediate layer 30 including the light emission layer propagate directly in the same direction (the −y direction) as the light L1 and are emitted outside, while the other lights L2' and L3' propagate in the direction (the +y direction) toward the reflector 55, are reflected by the reflector 55, propagate in the same direction (the −y direction) as the light L1, and are emitted to the outside.

In the case of the organic light-emitting illumination apparatus according to the exemplary embodiment, when the first flexible substrate 10 and the second flexible substrate 50 are bent and folded a plurality of times to provide a light emission area corresponding to the reflector 55 as illustrated in FIG. 4, since all the lights L1, L2, L2', L3, and L3' propagate in the same direction (−y direction), a high-brightness organic light-emitting illumination apparatus may be implemented. In this case, because the strength of an electrical signal applied to emit sufficiently bright light is not increased, but the first flexible substrate 10 and the second flexible substrate 50 are simply bent and folded a plurality of times, a reduction of the lifetime of an organic light-emitting device may be effectively prevented.

Instead of disposing the reflector 55 in the first region on the second flexible substrate 50, the first electrode 20 or the second electrode 40 may be formed as a reflective electrode in the first region, and formed as a transparent electrode in regions other than the first region. However, in this case, the process of forming the first electrode 20 or the second electrode 40 may be overly-complicated, and thus, the manufacturing yield of organic light-emitting illumination apparatuses may be significantly reduced.

However, in the case of the organic light-emitting illumination apparatus according to the exemplary embodiment, in the manufacturing process thereof, the first electrode 20 or the second electrode 40 has only to be formed of a material capable of transmitting light in the entire region. Also, the reflector 55 may be formed only in the first region on the second flexible substrate 50 by deposition or sputtering. Thus, in the case of the organic light-emitting illumination apparatus according to the exemplary embodiment, because the manufacturing process thereof is simple, the manufacturing yield may be significantly increased.

As illustrated in FIG. 3, the organic light-emitting illumination apparatus may further include a buffer layer 45 that is interposed between the second flexible substrate 50 and the second electrode 40, and between the reflector 55 and the second electrode 40. If the buffer layer 45 is not present, an empty space may exist between the second electrode 40 and the second flexible substrate 50 in the vicinity of the edge of the reflector 55 as a result of a step difference caused by the reflector 55. Also, because the adhesive force between the reflector 55 and the second electrode 40 is not strong, delamination may occur between the reflector 55 and the second electrode 40 in the process of manufacturing or using the organic light-emitting illumination apparatus.

However, as a result of the buffer layer 45 being interposed between the second flexible substrate 50 and the second electrode 40 and between the reflector 55 and the second electrode 40, the buffer layer 45 and the reflector 55 may be smoothly attached and thus the overall stability of the organic light-emitting illumination apparatus may be significantly increased. In particular, when the buffer layer 45 is formed of an elastic material, it may be possible to prevent the occurrence of a step difference caused by the reflector 55 between the second electrode 40 and the second flexible substrate 50. The buffer layer 45 may be formed of an organic material. In detail, the buffer layer 45 may be formed of a hole transport material that may be included in the intermediate layer 30.

In the case of the buffer layer 45, as illustrated in FIG. 3, the first thickness t1 of the buffer layer 45 in the first region of the second flexible substrate 50, that is, the first thickness t1 of the buffer layer 45 at the portion corresponding to the reflector 55, may be less than the second thickness t2 of the buffer layer 45 in the second region of the second flexible substrate 50. Accordingly, the occurrence of a step difference due to the existence of the reflector 55 in the organic light-emitting illumination apparatus may be effectively prevented. According to an exemplary embodiment, the buffer layer 45 may be formed to correspond to the entire region of the second electrode 40.

Figure 5:
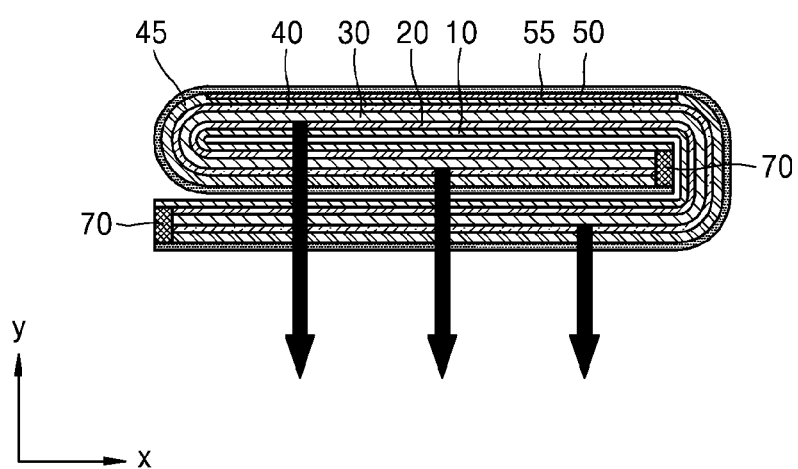
FIG. 5 is a cross-sectional view schematically illustrating an organic light-emitting illumination apparatus according to another exemplary embodiment.

Although FIGS. 3 and 4 illustrate that one edge of the reflector 55 is adjacent to one edge of the second flexible substrate 50, exemplary embodiments are not limited thereto. For example, the reflector 55 may be located at a center portion of the second flexible substrate 50, as illustrated in FIG. 5. In this case, a portion of one side of the reflector 55 and a portion of other side thereof are folded around the portion of the second flexible substrate 50 corresponding to the reflector 55 to cover the portion of the second flexible substrate 50 corresponding to the reflector 55, so that the organic light-emitting illumination apparatus may be used to emit high-brightness light.

As described above, according to the above-described exemplary embodiments, an organic light-emitting illumination apparatus may be easily manufactured to provide high-brightness illumination.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light-emitting illumination apparatus comprising:
    a first flexible substrate;
    a first electrode disposed on the first flexible substrate and configured to transmit light;
    an intermediate layer disposed on the first electrode and comprising a light emission layer;
    a second electrode disposed on the intermediate layer and configured to transmit light;
    a second flexible substrate disposed on the second electrode;
    a reflector interposed between the second flexible substrate and the second electrode to correspond to a first region of the second flexible substrate; and
    a buffer layer interposed between the second flexible substrate and the second electrode and between the reflector and the second electrode.

2. The organic light-emitting illumination apparatus of claim 1, wherein:
    the buffer layer corresponds to the first region of the second flexible substrate and a second region of the second flexible substrate; and
    the second region comprises a residual portion of the second flexible substrate other than the first region.

3. The organic light-emitting illumination apparatus of claim 2, wherein a first thickness of the buffer layer in the first region of the second flexible substrate is less than a second thickness of the buffer layer in the second region of the second flexible substrate.

4. The organic light-emitting illumination apparatus of claim 1, wherein the buffer layer has an elastic characteristic.

5. The organic light-emitting illumination apparatus of claim 1, wherein the buffer layer comprises a hole transport material.

6. An organic light-emitting illumination apparatus comprising:
    a first flexible substrate;
    a first electrode disposed on the first flexible substrate and configured to transmit light;
    an intermediate layer disposed on the first electrode and comprising a light emission layer;
    a second electrode disposed on the intermediate layer and configured to transmit light;
    a second flexible substrate disposed on the second electrode; and
    a reflector interposed between the second flexible substrate and the second electrode to correspond to a first region of the second flexible substrate,
    wherein the first flexible substrate and the second flexible substrate are bent and folded a plurality of times to provide a light emission area corresponding to the reflector.

7. The organic light-emitting illumination apparatus of claim 6, wherein a portion of the second flexible substrate corresponding to the reflector is not covered by the first flexible substrate or other portions of the second flexible substrate.

8. The organic light-emitting illumination apparatus of claim 1, wherein one edge of the reflector is adjacent to one edge of the second flexible substrate.

* * * * *